(12) United States Patent
Onodera et al.

(10) Patent No.: US 9,118,011 B2
(45) Date of Patent: Aug. 25, 2015

(54) LANGASITE-TYPE OXIDE MATERIAL, METHOD FOR PRODUCING SAME, AND RAW MATERIAL USED IN THE PRODUCTION METHOD

(75) Inventors: Ko Onodera, Tokyo (JP); Kazushige Tohta, Tokyo (JP); Masato Sato, Tokyo (JP); Akira Yoshikawa, Sendai (JP); Yuui Yokota, Sendai (JP)

(73) Assignee: TDK Corporation, Tokyo (JP)

(*) Notice: Subject to any disclaimer, the term of this patent is extended or adjusted under 35 U.S.C. 154(b) by 178 days.

(21) Appl. No.: 13/878,921

(22) PCT Filed: Oct. 12, 2011

(86) PCT No.: PCT/JP2011/005721
§ 371 (c)(1),
(2), (4) Date: Apr. 11, 2013

(87) PCT Pub. No.: WO2012/049846
PCT Pub. Date: Apr. 19, 2012

(65) Prior Publication Data
US 2013/0240776 A1    Sep. 19, 2013

(30) Foreign Application Priority Data

Oct. 13, 2010    (JP) .................................. 2010-230705

(51) Int. Cl.
*C30B 29/34*    (2006.01)
*C30B 29/30*    (2006.01)
(Continued)

(52) U.S. Cl.
CPC .............. *H01L 41/183* (2013.01); *C04B 35/18* (2013.01); *C04B 35/195* (2013.01); *C30B 15/00* (2013.01);
(Continued)

(58) Field of Classification Search
USPC .......... 252/62.9 R; 117/19, 13, 220, 942, 948
See application file for complete search history.

(56) References Cited

U.S. PATENT DOCUMENTS 6,302,956 B1    10/2001  Alenkov et al.
2002/0015452 A1*  2/2002  Chai et al. ..................... 375/316
(Continued)

FOREIGN PATENT DOCUMENTS

CN    101275279 A    10/2008
JP    2001 527500    12/2001
(Continued)

OTHER PUBLICATIONS

Jung, I. H. et al., "Single Crystal Growth and Characterizations of A3BC3D2O14-Type Compounds for Piezoelectric Applications," Jpn. J. Appl. Phys., The Japan Society of Applied Physics, vol. 40, Part 1, No. 9B, pp. 5706 to 5709, (Sep. 2001).
(Continued)

*Primary Examiner* — Carol M Koslow
(74) *Attorney, Agent, or Firm* — Oblon, McClelland, Maier & Neustadt, L.L.P.

(57) ABSTRACT

An oxide material having a langasite-type structure having a desired surface condition and a desired outer shape is obtained stably. By adding at least one selected from the group consisting of Ir, Pt, Au, and Rh to a raw material which is a composition used for producing a desired oxide material as an additive element, it is possible to control the wettability between a die portion at a bottom end of a crucible and a melt of the raw material, thereby implementing stable production of the oxide material while controlling the wetting and spread of the melt of the raw material leaked out through a hole of the crucible.

8 Claims, 10 Drawing Sheets

(51) Int. Cl.
   *C30B 15/08* (2006.01)
   *C04B 35/16* (2006.01)
   *C04B 35/00* (2006.01)
   *H01L 41/18* (2006.01)
   *C04B 35/18* (2006.01)
   *C04B 35/195* (2006.01)
   *C30B 15/00* (2006.01)
   *C30B 15/04* (2006.01)

(52) U.S. Cl.
   CPC ............ *C30B 15/04* (2013.01); *C30B 15/08* (2013.01); *C30B 29/34* (2013.01); *C04B 2235/3206* (2013.01); *C04B 2235/3208* (2013.01); *C04B 2235/3213* (2013.01); *C04B 2235/3215* (2013.01); *C04B 2235/3217* (2013.01); *C04B 2235/3251* (2013.01); *C04B 2235/3286* (2013.01); *C04B 2235/3289* (2013.01)

(56) References Cited

U.S. PATENT DOCUMENTS

2002/0053856 A1* 5/2002 Inoue et al. .............. 310/313 A
2003/0146481 A1* 8/2003 Inoue et al. .................. 257/416

FOREIGN PATENT DOCUMENTS

| JP | 2003 246698 | 9/2003 |
| JP | 2007 112700 | 5/2007 |
| JP | 2007 197269 | 8/2007 |
| JP | 2008 133187 | 6/2008 |

OTHER PUBLICATIONS

Chai, B.H.T. et al., "A New Class of Ordered Langasite Structure Compounds", 2000 IEEE/EIA International Frequency Control Symposium and Exhibition, pp. 163 to 168, (2000).

International Search Report Issued Dec. 13, 2011 in PCT/JP11/05721 Filed Oct. 12, 2011.

International Preliminary Report on Patentability issued May 16, 2013, in International Application No. PCT/JP2011/005721 (English translation only).

International Preliminary Report on Patentability issued Apr. 25, 2013, in International Application No. PCT/JP2011/005721 (with English translation).

Combined Chinese Office Action and Search Report issued Jan. 28, 2015 in Patent Application No. 201180049364.3 (with English language translation and Translation of Category of Cited Documents).

* cited by examiner

LANGASITE-TYPE OXIDE MATERIAL, METHOD FOR PRODUCING SAME, AND RAW MATERIAL USED IN THE PRODUCTION METHOD

TECHNICAL FIELD

The present invention relates to an oxide material having a langasite-type structure, which is a promising piezoelectric device material used in a high temperature region, a method for producing the same, and a raw material for producing the oxide material used in the production method.

BACKGROUND ART

An oxide material having a langasite-type structure, especially a single crystal thereof has the properties of a) having a piezoelectric constant several times as large as that of quartz, b) producing less change in propagation velocity of surface acoustic wave with temperature, and c) having a high electromechanical coupling factor. Focusing attention on these properties, the oxide material is used as a material of a piezoelectric vibrator in a piezoelectric device such as an actuator, a SAW filer, an oscillator, a piezoelectric gyro, and a piezoelectric transformer. Here, when the oxide material is used as a piezoelectric device material, it is preferable for the oxide material to have a higher piezoelectric constant, and therefore, it is preferable to be used as a crystal-oriented single crystal. Moreover, the oxide material is considered the most suitable material for use in high temperature environment because the material does not undergo any phase transition in a temperature region from room temperature to the melting temperature.

For the production of such a langasite-type oxide material, especially for the production of a single crystal thereof, a so-called melt growth method including a Czochralski method using resistance heating, high-frequency induction heating, infrared ray concentrating heating, or the like; a Bridgman method; a micro pulling down method; an EFG method; and a floating-zone method is used. Especially, the micro pulling down method is known as a method by which an excellent single crystal can be obtained at a low cost in comparison with other methods because this method takes short time for crystal growth and near net production is possible, and therefore, there is a demand for application of the method to the production technology of the single crystal of the oxide material. However, when melt growth of the single crystal is conducted, a so-called wettability on a boundary surface between a melt of a raw material of the single crystal and a die portion of a crucible is too high (wetting angle is too small) and the melt exhibits such behavior as going up a side surface of the die portion, and therefore, it is regarded as difficult to achieve stable single crystal growth.

Under the circumstances described above, Patent Literature 1 discloses a method of providing a crucible with a structure that controls behavior of the melt of the raw material, thereby allowing stable crystal growth while controlling a shape such as an outer shape of the single crystal of the oxide material. Moreover, Patent Literature 2 discloses a method of selecting a material of the crucible, thereby suppressing the above-mentioned behavior of the melt going up a side surface of the die portion to conduct single crystal growth.

CITATION LIST

Patent Literature

PTL 1: Japanese Patent Application Laid-Open No. 2007-197269
PTL 2: Japanese Patent Application Laid-Open No. 2007-112700

SUMMARY OF INVENTION

Technical Problem

By using the crucible having the structure disclosed in Patent Literature 1, it is possible to stably obtain a single crystal of a langasite-type oxide material having a desired surface condition. However, the shape of the crucible disclosed in the Patent Literature is special, and therefore, the production of the crucible needs a lot of cost. Moreover, since there is a need to satisfy conditions defined in the Patent Literature, there are many difficulties in changing the shape of the crucible variously, and for example, a problem is that only a single crystal having a limited shape can be grown because a cross-sectional shape perpendicular to a pulling down axis of the melt is unambiguously determined. Furthermore, the method disclosed in Patent Literature 2 employs a crucible made of a material having an appropriate so-called wetting angle with the melt of the raw material. However, in the method, there is a need to investigate and select a crucible made of a material having a preferable wetting angle depending on a composition of the single crystal to be obtained. Therefore, for example, in the case of high-mix low-volume production, a versatility problem is that a crucible corresponding to the material has always to be prepared.

The present invention was made in view of the above circumstances, and an object of the present invention is to provide an oxide material having a langasite-type structure which can have a desired shape stably regardless of the shape or the material of a crucible, a method for producing the oxide material with high versatility, and a composition serving as a raw material required for producing the oxide material.

Solution to Problem

In order to solve the above problems, an oxide material according to the present invention is an oxide material having a langasite-type structure, having a composition included in the group consisting of the formula $AE_3TaGa_{3-x}Al_xSi_2O_{14}$ (1) (wherein, AE represents an element selected from the group consisting of Mg, Ca, Sr, and Ba, which are alkaline earth metal elements, and $0 \leq X \leq 3$) and the formula $AE_3NbGa_{3-x}Al_xSi_2O_{14}$ (2) (wherein, AE represents an element selected from the group consisting of Mg, Ca, Sr, and Ba, which are alkaline earth metal elements, and $0 \leq X \leq 3$), and comprising at least one selected from the group consisting of Ir, Pt, Au, and Rh as an additive element. Note that it is preferable that the oxide material has a melting temperature of less than 1470° C., and further, it is more preferable that X is in the range of $0 < X \leq 3$ in the formulas (1) and (2).

Alternatively, in order to solve the above problems, an oxide material according to the present invention is an oxide material having a composition included in the group consisting of $Ca_3TaGa_{3-x}Al_xSi_2O_{14}$ ($0 \leq X \leq 3$), $Ca_3NbGa_{3-x}Al_xSi_2O_{14}$ ($0 \leq X \leq 3$), $Sr_3TaGa_{3-x}Al_xSi_2O_{14}$ ($0 \leq X \leq 3$), and $Sr_3NbGa_{3-x}Al_xSi_2O_{14}$ ($0 \leq X \leq 3$), and comprising at least one selected from the group consisting of Ir, Pt, Au, and Rh as an additive element. Note that it is preferable that the oxide material has a melting temperature of less than 1470° C., and further, it is more preferable that X is in the range of $0 < X \leq 3$.

Note that it is more preferable that the oxide material is a single crystal. Furthermore, the oxide material includes such forms as powders, ceramics, multi-crystals, and single crystals.

In order to solve the above problem, a raw material for producing an oxide material according to the present invention is a raw material comprising a composition for producing an oxide material having a langasite-type structure included in the group consisting of the formula $AE_3TaGa_{3-X}Al_XSi_2O_{14}$ (1) (wherein, AE represents an element selected from the group consisting of Mg, Ca, Sr, and Ba, which are alkaline earth metal elements, and $0 \leq X \leq 3$) and the formula $AE_3NbGa_{3-X}Al_XSi_2O_{14}$ (2) (wherein, AE represents an element selected from the group consisting of Mg, Ca, Sr, and Ba, which are alkaline earth metal elements, and $0 \leq X \leq 3$), and further comprising at least one selected from the group consisting of Ir, Pt, Au, and Rh as an additive element. Note that it is preferable that the raw material has a melting temperature of less than 1470° C., and further, it is more preferable that X is in the range of $0 < X \leq 3$ in the formulas (1) and (2).

Alternatively, in order to solve the above problems, a raw material for producing an oxide material according to the present invention is a raw material comprising a composition for producing an oxide material included in the group consisting of $Ca_3TaGa_{3-X}Al_XSi_2O_{14}$ ($0 \leq X \leq 3$), $Ca_3NbGa_{3-X}Al_XSi_2O_{14}$ ($0 \leq X \leq 3$), $Sr_3TaGa_{3-X}Al_XSi_2O_{14}$ ($0 \leq X \leq 3$), and $Sr_3NbGa_{3-X}Al_XSi_2O_{14}$ ($0 \leq X \leq 3$), and further comprising at least one selected from the group consisting of Ir, Pt, Au, and Rh as an additive element. Note that it is preferable that the raw material has a melting temperature of less than 1470° C., and further, it is more preferable that X is in the range of $0 < X \leq 3$.

In order to solve the above problems, a shape control and growth method for oxide material growth according to the present invention comprises packing the raw material in a crucible, melting the packed raw material, allowing a melt of the molten raw material to leak out through a hole provided in a die portion of the crucible, to spread on the die portion, contacting a seed with the melt of the raw material leaked out on the die portion, to produce a desired solid oxide material from the contact portion, moving the seed in a direction in which the seed is relatively pulled away from a die portion side of the crucible along a prescribed vertical axis, to grow the oxide material.

In order to solve the above problems, a shape control and growth method for oxide material growth according to the present invention comprises packing a raw material comprising a composition making up a composition of a desired solid oxide material in a crucible, melting the packed raw material, allowing a melt of the molten raw material to leak out through a hole provided in a die portion of the crucible, to spread on the die portion, contacting a seed with the melt of the raw material leaked out on the die portion, to produce the oxide material from the contact portion, moving the seed in a direction in which the seed is relatively pulled away from a die portion side of the crucible along a prescribed vertical axis, to produce the oxide material, the method further comprising a step of adding at least one selected from the group consisting of Ir, Pt, Au, and Rh to the raw material at least sometime during the packing of the raw material in the crucible or the melting of the packed raw material.

Advantageous Effects of Invention

According to the present invention, it is possible to conduct crystal growth by using a crucible with a die portion having a shape most suitable for a shape of an oxide material to be grown, especially for a shape of a single crystal thereof, and therefore, it is possible to stably and easily grow and supply an oxide material having a desired shape and surface condition. More particularly, the oxide material, further a single crystal thereof, can be provided with a shape corresponding to a cross-sectional shape orthogonal to a crystal growth direction in a die portion. Moreover, according to the present invention, it is possible to use a conventionally known material and a crucible for which no complicated processing is required in the shape, and therefore, a high-cost processing, for example, required for the crucible descried in Patent Literature 1 is not required, which enables reduction in the cost required for the production of piezoelectric devices and the like. Furthermore, since there is no need to prepare a crucible corresponding to a raw material to be used as in Patent Literature 2, it is possible to easily meet requirements such as high-mix low-volume production.

DESCRIPTION OF EMBODIMENTS

Figure 1:
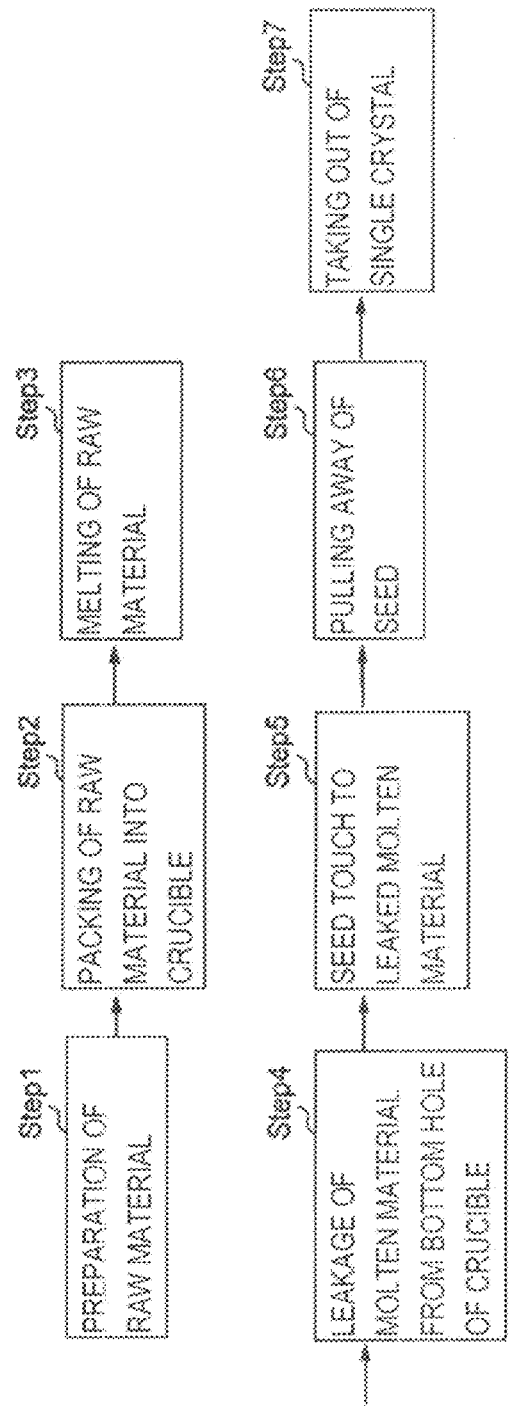
FIG. 1 is a flow diagram illustrating production steps of an oxide crystal material according to one embodiment of the present invention.

Hereinafter, a description will be given of a method of growing a single crystal of a langasite-type oxide according to one embodiment the present invention with reference to a flow chart shown in FIG. 1 and a schematic diagram of a so-called pulling down apparatus shown in FIGS. 2A to 2E. It is noted that, in production steps described in detail below, explanation will be given considering various substances to be packed in a crucible collectively as a raw material. The pulling down apparatus shown in FIGS. 2A to 2E comprises a crucible 1, a stage 3, an after heater 5, a heat retaining tube 7, a working coil 9, and a seed holding member 11 as main constituents. The crucible 1 is adapted to allow liquid retained therein, that is, a melt of a raw material to leak out through a hole provided at a lower portion, and in the leakage portion, a structural portion 1a, which is referred to as a die portion, having the action of regulating a range where the melt wets and spreads is arranged. The working coil 9 emits high-frequency radiation and allows the crucible 1 to produce heat by high-frequency induction. The after heater 5 having a tubular shape is arranged at the lower portion of the crucible 1 so as to have the same axis as that of the crucible 1, and produces heat by high-frequency induction as is the case with the crucible 1. The heat retaining tube 7 is a tubular member comprising a quartz tube and/or an insulating material, and inhibits the heat of the crucible 1 from being emitted and spreading to an outside of the crucible. The crucible 1, the after heater 5, and the heat retaining tube 7 are supported by the stage 3 so that they are arranged at appropriate positions at an inside of the working coil 9 having a coil shape.

Figure 2A:
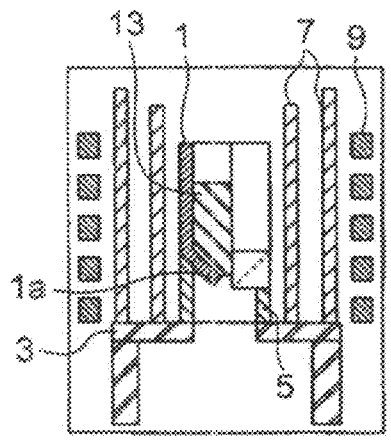
FIG. 2A is a diagram schematically illustrating a state in step 2 in the flow diagram of FIG. 1.

Next, an actual growth method will be described. It is noted that a case of producing a single crystal of an oxide material is exemplified as an Example, while the production method according to one embodiment of the present invention is targeted at oxide materials including forms such as ceramics. In the growth method shown in FIG. 1, preparation of a raw material is conducted in step 1. For example, the present embodiment intends to obtain a langasite-type oxide material, specifically as a single crystal thereof a composition represented as $Ca_3NbGa_3Si_2O_{14}$. In this case, $CaCO_3$ powders, $Nb_2O_5$ powders, β-$Ga_2O_3$ powders, and $SiO_2$ powders, which are compositions having a purity of 99.99 wt % or more and serve as a raw material, are prepared. These powders are weighed according to the chemical formula and mixed sufficiently. At this point, at least one selected from the group consisting of Ir, Pt, Au, and Rh, in the present embodiment, Au powders are further added to the mixture of the powders of the compositions as an additive element in a prescribed amount and mixing is performed. The mixture having the additive element added thereto is the raw material in the present invention. In step 2, the raw material, which is a mixture prepared in step 1, is pressed to have a form of a powder compact having a prescribed shape, and then, packed in the crucible made of a platinum-rhodium alloy. FIG. 2A shows a state in which a powder compact 13 of the raw material is packed in the crucible 1.

Figure 2B:
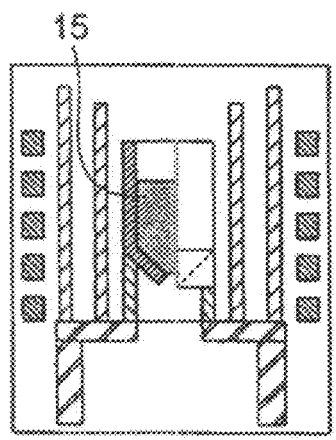
FIG. 2B is a diagram illustrating a state in step 3 in the flow diagram of FIG. 1, at which melting of a raw material is started.
Figure 2C:
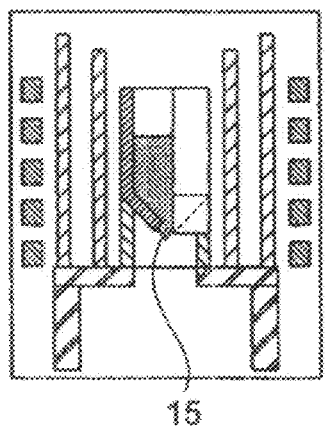
FIG. 2C is a diagram illustrating a state in step 4 in the flow diagram of FIG. 1, in which a melt of the raw material starts to leak out from a bottom of a crucible.

High-frequency radiation is applied from the working coil 9 to the crucible 1 having the raw material packed therein in step 2, to allow the crucible 1 to produce heat by high-frequency induction and melting of the powder compact 13 is conducted as shown in step 3. FIG. 2B shows a state in which heat production of the crucible 1 and thereby melting of the powder compact 13 start. After that, a melt 15 of the raw material generated by melting of the powder compact 13 partially leaks out through a hole which is provided at the lower portion of the crucible 1 and, for example, has an inner diameter of 0.5 mm. At this point, the melt 15 wets and spreads on the die portion 1a which is arranged at a neighboring portion of an opening of the hole in the crucible 1 depending on the so-called wettability between the melt 15 and the neighboring portion of the opening (step 4). FIG. 2C shows this state. The melt 15 of the raw material wets and spreads in a prescribed region of a surface of the die portion 1a, and in this state, contact between a bottom end of the melt 15 and a seed 17 held by the seed holding member 11 is achieved. In the present embodiment, the hole at the lower portion of the crucible 1 is described as just a hole, but the hole can take various shapes including a slit that can define the outer shape of the crystal, and also a plurality of such holes can be formed. Herein, the hole is defined as a whole of these forms. In the present embodiment, a crystal having a composition of $Ca_3NbGa_3Si_2O_{14}$ is used as a seed crystal for growing the oxide material to be obtained, that is, the seed 17. An upper portion of the seed 17 having a prescribed crystal axis is contacted with the melt 15 of the raw material leaked out on the die portion 1a (seed touch in step 5).

Figure 2D:
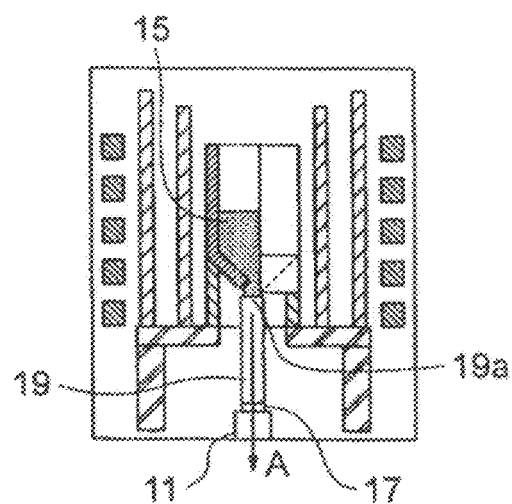
FIG. 2D is a diagram illustrating a state in step 5 in the flow diagram of FIG. 1, in which a seed after touching the seed to the leaked melt is pulled down for some distance.
Figure 2E:
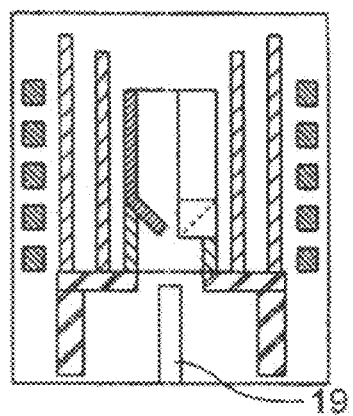
FIG. 2E is a diagram illustrating a state in step 7 in the flow diagram of FIG. 1, in which a single crystal is taken out.

In the present embodiment, a growing portion of an oxide material 19 generated under the crucible 1, that is, an interfacial surface 19a between the melt 15 of the raw material and the oxide material 19 having become solid is covered by the after heater 5. Moreover, the interfacial surface 19a, which is the growing portion of the oxide material 19, is observed by a CCD camera or the like, and thereby, it is possible to arbitrarily change pulling down conditions such as a pulling down velocity. After the seed touch described above, an appropriate temperature gradient is achieved and solidification of the melt 15, that is, generation of the oxide material 19 starts, and then, pulling down of the seed in step 6 is started. By keeping the pulling down velocity of the seed appropriately, unidirectional solidification of the oxide material 19 proceeds from the upper portion of the seed 17. By appropriately controlling conditions including the pulling down velocity, it is possible to obtain the oxide material 19 which is a single crystal having a desired crystal orientation. FIG. 2D shows a state in which the pulling down operation described here is conducted to some extent. The pulling down of the seed is conducted along a prescribed vertical axis A shown in FIG. 2D. However, actual steps are not limited to the manner described above, and it is only necessary that the seed 17 is moved in a direction in which the seed is relatively pulled away from a side where the die portion side 1a of the crucible 1 is present. Specifically, there may be employed such manners as moving the crucible 1 with fixing the seed 17, or moving both of them. After that, the obtained oxide material 19 is taken out (step 7 and FIG. 2E), subjected to a post-processing such as surface treatment and cutting into a prescribed size, and used for various purposes. It is noted that, in the embodiment described here, a so-called crystal growth method with shape control which controls the outer shape of the oxide material 19 by utilizing the shape of the die portion 1a and the melt 15 of the raw material wetting and spreading on the die portion 1a is used. In the present invention, a more preferable result, specifically the effect of shape control can be achieved in the crystal growth method with shape control.

Figure 3:
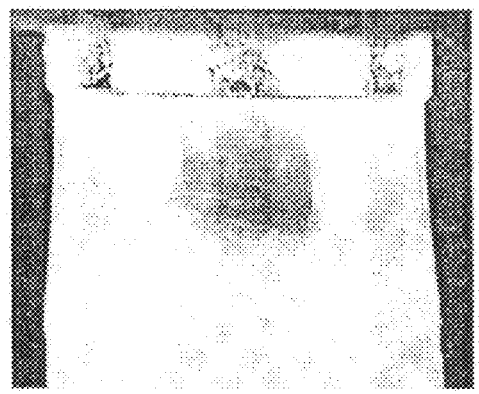
FIG. 3 is a photograph showing a die portion, a single crystal, and a space between the two in the actual pulling down step in an Example of the present invention and a diagram schematically illustrating their positional relation.
Figure 3:
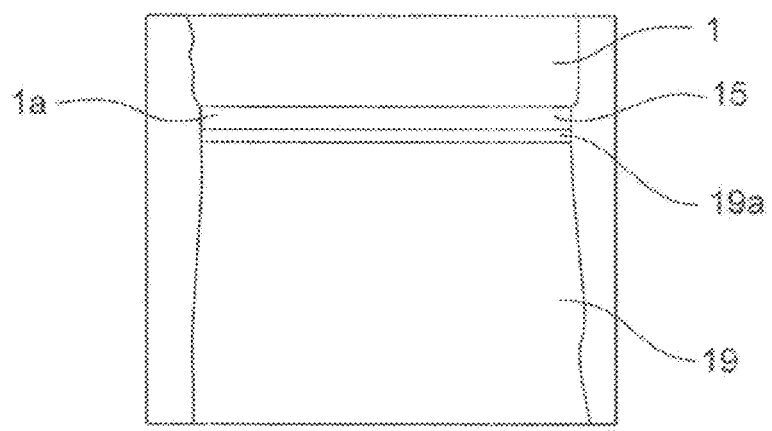
Figure 4:
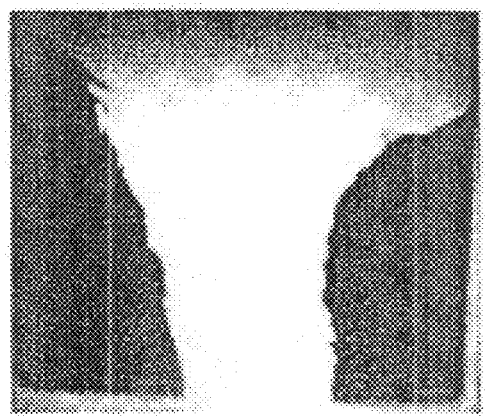
FIG. 4 is a photograph and a diagram of a Comparative Example which is a contrast example of the Example shown in FIG. 3, described in the same manner as in FIG. 3.
Figure 4:
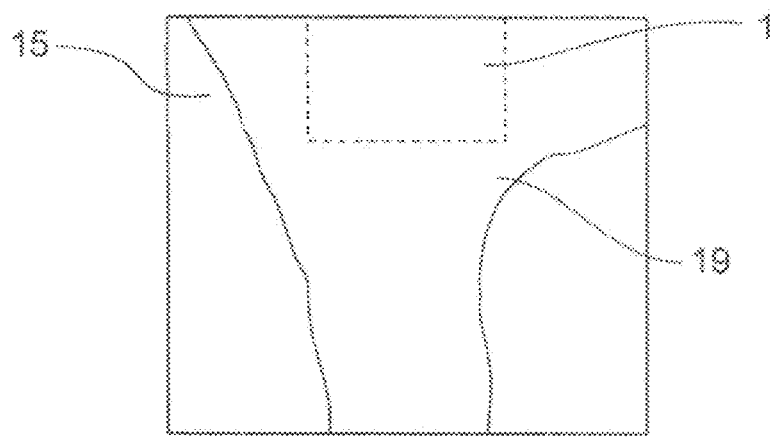

FIG. 3 shows a photograph of a bottom end of the crucible 1, the oxide material 19, and the growing portion at the time of pulling down operation in the embodiment of the present invention described above, and its explanatory diagram. As shown in the figure, the growth of the oxide material 19 proceeds from a state in which the melt 15 wets and spreads on a desired region of the die portion 1a and the meniscus (the above described interfacial surface) 19a having almost constant width is formed. FIG. 4 is those of a bottom end of the crucible 1 and the like in the case of adding none of Ir, Pt, Au, or Rh, described in the same manner as in FIG. 3. The melt 15 goes up not only the die portion 1a but also the crucible 1 up to a considerably upper portion from the lower portion, and a boundary between the oxide material 19 and the melt 15 is not clear. As a result, the shape and the like of the oxide material 19 are not stable at all. Consequently, it can be understood that implementing the present invention exerts a special effect of obtaining the oxide material 19 having a desired shape.

Figure 5A:
FIG. 5A is an actual diagram of an oxide material obtained by adding Au to $Ca_3NbGa_3Si_2O_{14}$, which is one embodiment of the present invention obtained by implementing the present invention.
Figure 5B:
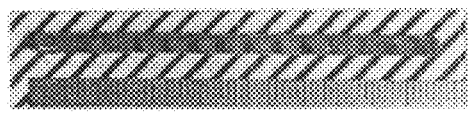
FIG. 5B is an actual diagram of an oxide material obtained by adding Au to $Ca_3NbGa_{1.5}Al_{1.5}Si_2O_{14}$, which is one embodiment of the present invention obtained by implementing the present invention.
Figure 5C:
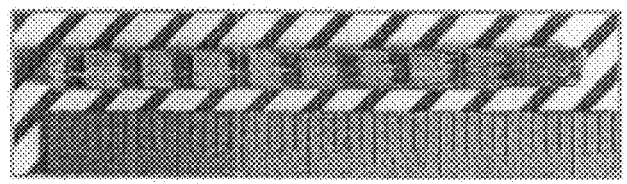
FIG. 5C is an actual diagram of an oxide material obtained by adding Au to $Ca_3TaGa_3Si_2O_{14}$, which is one embodiment of the present invention obtained by implementing the present invention.
Figure 5D:
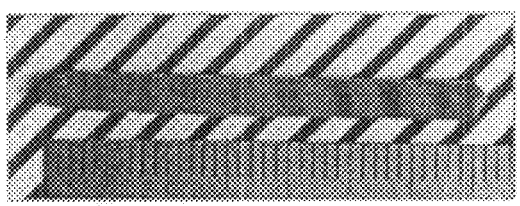
FIG. 5D is an actual diagram of an oxide material obtained by adding Au to $Ca_3TaGa_{1.5}Al_{1.5}Si_2O_{14}$, which is one embodiment of the present invention obtained by implementing the present invention.
Figure 5E:
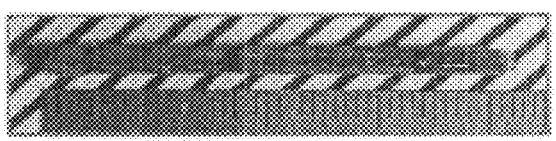
FIG. 5E is an actual diagram of an oxide material obtained by adding Au to $Sr_3NbGa_3Si_2O_{14}$, which is one embodiment of the present invention obtained by implementing the present invention.
Figure 5F:
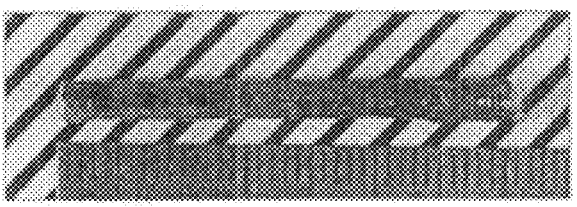
FIG. 5F is an actual diagram of an oxide material obtained by adding Au to $Sr_3NbGa_{1.5}Al_{1.5}Si_2O_{14}$, which is one embodiment of the present invention obtained by implementing the present invention.
Figure 5G:
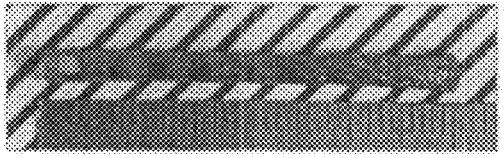
FIG. 5G is an actual diagram of an oxide material obtained by adding Au to $Sr_3TaGa_3Si_2O_{14}$, which is one embodiment of the present invention obtained by implementing the present invention.
Figure 5H:
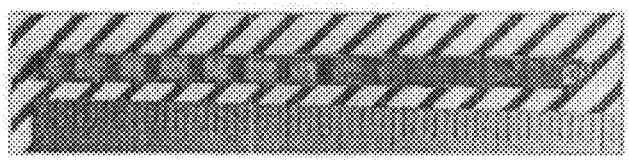
FIG. 5H is an actual diagram of an oxide material obtained by adding Au to $Sr_3TaGa_{1.5}Al_{1.5}Si_2O_{14}$, which is one embodiment of the present invention obtained by implementing the present invention.
Figure 5I:
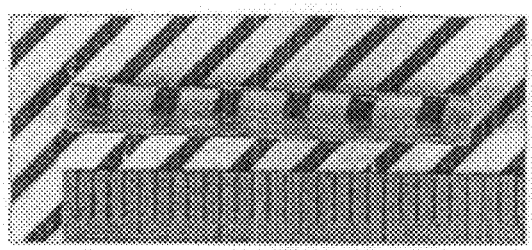
FIG. 5I is an actual diagram of an oxide material obtained by adding Au to $La_3Ta_{0.5}Ga_{5.5}O_{14}$, which is one embodiment of the present invention obtained by implementing the present invention.
Figure 5J:
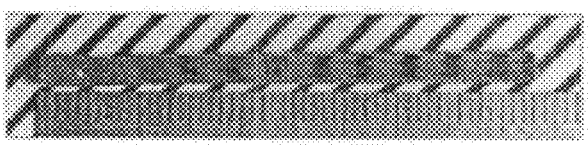
FIG. 5J is an actual diagram of an oxide material obtained by adding Au to $La_3Ta_{0.5}Ga_5Al_{0.5}O_{14}$, which is one embodiment of the present invention obtained by implementing the present invention.
Figure 5K:
FIG. 5K is an actual diagram of an oxide material obtained by adding Au to $La_3Nb_{0.5}Ga_{5.5}O_{14}$, which is one embodiment of the present invention obtained by implementing the present invention.
Figure 5L:
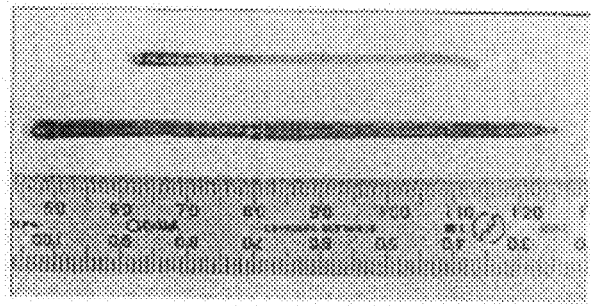
FIG. 5L is an actual diagram of oxide materials obtained by adding Au to $La_3Nb_{0.5}Ga_{5.3}Al_{0.2}O_{14}$ and $La_3Nb_{0.5}Ga_{5.4}Al_{0.1}O_{14}$, which is one embodiment of the present invention obtained by implementing the present invention.
Figure 5M:
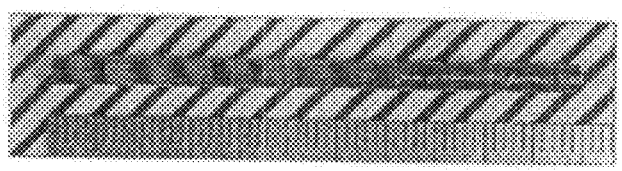
FIG. 5M is an actual diagram of an oxide material obtained by adding Au to $La_3Ga_5SiO_{14}$, which is one embodiment of the present invention obtained by implementing the present invention.
Figure 5N:
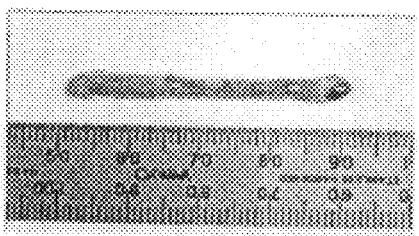
FIG. 5N is an actual diagram of an oxide material obtained by adding Au to $La_3Ga_{4.8}Al_{0.2}SiO_{14}$, which is one embodiment of the present invention obtained by implementing the present invention.
Figure 5O:
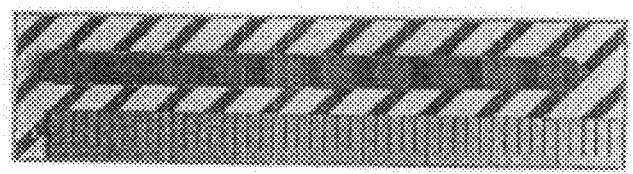
FIG. 5O is an actual diagram of an oxide material obtained by adding Pt to $La_3Ta_{0.5}Ga_{5.5}O_{14}$, which is one embodiment of the present invention obtained by implementing the present invention.
Figure 5P:
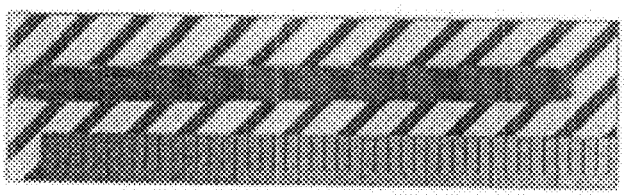
FIG. 5P is an actual diagram of an oxide material obtained by adding Rh to $La_3Ta_{0.5}Ga_{5.5}O_{14}$, which is one embodiment of the present invention obtained by implementing the present invention.
Figure 5Q:
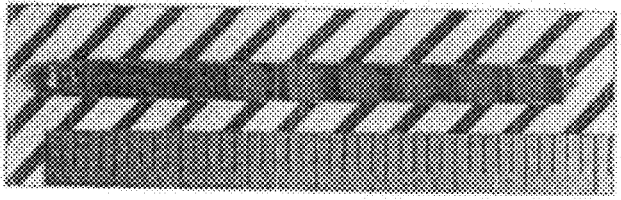
FIG. 5Q is an actual diagram of an oxide material obtained by adding Ir to $La_3Ta_{0.5}Ga_{5.5}O_{14}$, which is one embodiment of the present invention obtained by implementing the present invention.

Hereinafter, photographs of single crystals of various oxide materials, which are Examples of the present invention, are shown. FIG. 5A shows a single crystal obtained by adding Au to $Ca_3NbGa_3Si_2O_{14}$. FIG. 5B shows a single crystal obtained by adding Au to $Ca_3NbGa_{1.5}Al_{1.5}Si_2O_{14}$. FIG. 5C shows a single crystal obtained by adding Au to $Ca_3TaGa_3Si_2O_{14}$. FIG. 5D shows a single crystal obtained by adding Au to $Ca_3TaGa_{1.5}Al_{1.5}Si_2O_{14}$. FIG. 5E shows a single crystal obtained by adding Au to $Sr_3NbGa_3Si_2O_{14}$. FIG. 5F shows a single crystal obtained by adding Au to $Sr_3NbGa_{1.5}Al_{1.5}Si_2O_{14}$. FIG. 5G shows a single crystal obtained by adding Au to $Sr_3TaGa_3Si_2O_{14}$. FIG. 5H shows a single crystal obtained by adding Au to $Sr_3TaGa_{1.5}Al_{1.5}Si_2O_{14}$. FIG. 5I shows a single crystal obtained by adding Au to $La_3Ta_{0.5}Ga_{5.5}O_{14}$. FIG. 5J shows a single crystal obtained by adding Au to $La_3Ta_{0.5}Ga_5Al_{0.5}O_{14}$. FIG. 5K shows a single crystal obtained by adding Au to $La_3Nb_{0.5}Ga_{5.5}O_{14}$. FIG. 5L (upper) shows a single crystal obtained by adding Au to $La_3Nb_{0.5}Ga_{5.3}Al_{0.2}O_{14}$ and FIG. 5L (lower) shows a single crystal obtained by adding Au to $La_3Nb_{0.5}Ga_{5.4}Al_{0.1}O_{14}$. FIG. 5M shows a single crystal obtained by adding Au to $La_3Ga_5SiO_{14}$. FIG. 5N shows a single crystal obtained by adding Au to $La_3Ga_{4.8}Al_{0.2}SiO_{14}$. FIG. 5O shows a single crystal obtained by adding Pt to $La_3Ta_{0.5}Ga_{5.5}O_{14}$. FIG. 5P shows a single crystal obtained by adding Rh to $La_3Ta_{0.5}Ga_{5.5}O_{14}$. FIG. 5Q shows a single crystal obtained by adding Ir to $La_3Ta_{0.5}Ga_{5.5}O_{14}$. As shown from these figures, it is understood that the oxide materials of the present invention are excellent in the surface condition and the shape or that such oxide materials, especially single crystals can be easily obtained by implementing the present invention.

The present applicant has made a study on single crystal growth by the conventional methods in the case of the oxide material having a langasite-type structure, which is required to grow in a preferable shape especially for use in the piezoelectric devices and the like. However, the melt of the raw material wetted and spread excessively on the neighboring portion of the opening of the hole in the crucible (die portion), further on a side surface of the crucible (a state of having a too small wetting angle) due to the wettability between the melt of the raw material and the die portion, and a grown crystal did not have a preferable surface condition, a uniform crystal diameter, and the like. This tendency has been particularly evident in an oxide material included in the group consisting of $RE_3Ga_{5-x}Al_xSiO_{14}$ (wherein, RE represents an element selected from the group consisting of La, Ce, Pr, Nd, Sm, Eu, Gd, Tb, Dy, Ho, Er, Tm, Yb, Lu, Y, and Sc, which are rare earth elements, and $0 \leq X \leq 5$), $RE_3Ta_{0.5}Ga_{5.5-x}Al_xO_{14}$ (wherein, RE represents an element selected from the group consisting of La, Ce, Pr, Nd, Sm, Eu, Gd, Tb, Dy, Ho, Er, Tm, Yb, Lu, Y, and Sc, which are rare earth elements, and $0 \leq X \leq 5.5$), $RE_3Nb_{0.5}Ga_{5.5-x}Al_xO_{14}$ (wherein, RE represents an element selected from the group consisting of La, Ce, Pr, Nd, Sm, Eu, Gd, Tb, Dy, Ho, Er, Tm, Yb, Lu, Y, and Sc, which are rare earth elements, and $0 \leq X \leq 5.5$), $AE_3TaGa_{3-x}Al_xSi_2O_{14}$ (wherein, AE represents an element selected from the group consisting of Mg, Ca, Sr, and Ba, which are alkaline earth metal elements, and $0 \leq X \leq 3$), and $AE_3NbGa_{3-x}Al_xSi_2O_{14}$ (wherein, AE represents an element selected from the group consisting of Mg, Ca, Sr, and Ba, which are alkaline earth metal elements, and $0 \leq X \leq 3$), and particularly evident in a single crystal thereof.

Furthermore, among them, the same tendency has been particularly evident in an oxide material included in the group consisting of $La_3Ga_{5-x}Al_xSiO_{14}$ ($0 \leq X \leq 5$), $La_3Ta_{0.5}Ga_{5.5-x}Al_xO_{14}$ ($0 \leq X \leq 5.5$), $La_3Nb_{0.5}Ga_{5.5-x}Al_xO_{14}$ ($0 \leq X \leq 5.5$), $Ca_3TaGa_{3-x}Al_xSi_2O_{14}$ ($0 \leq X \leq 3$), $Ca_3NbGa_{3-x}Al_xSi_2O_{14}$ ($0 \leq X \leq 3$), $Sr_3TaGa_{3-x}Al_xSi_2O_{14}$ ($0 \leq X \leq 3$), and $Sr_3NbGa_{3-x}Al_xSi_2O_{14}$ ($0 \leq X \leq 3$), which are promising piezoelectric materials, and more particularly evident in a single crystal thereof.

Under the above circumstances, the present applicant has found that the wetting and spread of the melt of raw material on the die portion can be preferably suppressed by adding at least one selected from the group consisting of Ir, Pt, Au, and Rh to the raw material for material growth, and that the effect is significantly exerted especially on these oxide-series materials. Moreover, the present applicant has also confirmed that adding at least one selected from the group consisting of Ir, Pt, Au, and Rh in an appropriate amount enables control of the shape, size, or the like of the crystal or the so-called meniscus which arises between the melt and the solid and in which growth of the material proceeds. It is noted that there are various materials that can change the wettability other than Ir, Pt, Au, and Rh, but in view of keeping the properties of the actual oxide material as the piezoelectric materials, Ir, Pt, Au, and Rh have been found to be most preferable as additive materials. As the material of the crucible used for growing the oxide material, there are iridium, platinum, a platinum-rhodium alloy, rhenium, molybdenum, and the like. Addition of Ir, Pt, Au, or Rh has the same effect of suppressing the wettability on the crucibles made of any of the above materials. When additive elements Ir, Pt, Au, and Rh are contained in the raw material, it can be thought that some of the additive elements present on a surface of the melt to be contacted with the die portion form oxides and the like. These oxides and the like have smaller wettability than the material making up the crucible (has a large wetting angle), and therefore, it is considered to be possible to control the wettability by the oxides or the like present between the melt and the die portion moderately. At the same time, when the additive elements are present excessively, unevenly, or the like, the wettability can decrease partially to an extreme degree, and there may be a problem on controlling the wettability. As in the present invention, by adding the additive element preliminarily to the raw material, the additive element can be present in the neighborhood of the die portion in an appropriate amount without being distributed unevenly, which enables preferable and stable control of the wettability.

As in the present invention, by employing a manner in which the additive element for controlling the wettability is added to the composition serving as the raw material before melting, it is possible to reproducibly achieve the wetting and spread of the melt on the die portion for any crucibles. Therefore, even in the case of high-mix low-volume production, it is possible to respond to the situation by using a single crucible. Moreover, it is possible to figure out the amount of addition of the additive element present in the melt accurately, and then, to control the degree of the wetting and spread accurately. Therefore, it is also possible to provide oxide materials having the same surface condition and the same surface shape reproducibly and continuously. It is noted that the present applicant has confirmed that Au has the greatest effect of suppressing the wettability, and the others: Ir, Pt, and Rh have smaller suppressing effects than Au with respect to the oxide material targeted in the present invention. Therefore, by adding any selected from the group consisting of Ir, Pt, and Rh in addition to Au, it is possible to control the degree of the wetting and spread more finely and increase the degree of reproducibility. By employing a manner in which other elements are added to Au and the resultant mixture is then added to major constituents of the raw material, for example, there can be expected such effects as controlling the total amount of the additive elements to be an appropriate amount from a view point of the physical properties of the oxide material and controlling the degree of the wetting and spread to be a preferable level.

Here, for controlling the degree of the wettability between the melt of the raw material and the die portion, it is necessary to preferably keep the amount of Ir, Pt, Au, Rh, or a mixture thereof added, further an existing ratio of Ir, Pt, Au, Rh, and the like in the meniscus. In the present embodiment, step 1 includes weighing of Ir, Pt, Au, Rh, or the like in an appropriate amount and addition thereof to produce the raw material for producing the oxide material. This enables appropriate control of the wettability between the melt of the raw material and the die portion. By conducting the subsequent steps of crystal growth using such material as the raw material, a preferable langasite-type oxide material, further a single crystal thereof can be obtained. Especially, in the case of a langasite-type oxide material which partially undergoes Al substitution, it is believed that Ir, Pt, Au, or Rh is contained in such a manner that these elements are substituted for Al partially, whereby the single crystal can retain the preferable physical properties, for example, the piezoelectric properties. Also, in the case of a langasite-type oxide material which partially undergoes Ga substitution, it is believed that Ir, Pt, Au, or Rh is contained in such a manner that these elements are substituted for Ga partially, whereby an effect similar to that in the case of Al substitution can be exerted. Here, it is considered to be preferable for the oxide material described above to contain Ir, Pt, Au, or Rh in such a manner that these elements are partially substituted for Al as described above. However, even in the case where Al is not present in the composition, it is believed that Ir, Pt, Au, or Rh intrudes in the area where Al should be present if Al is added and the effect obtained by addition of these elements can be maintained. Therefore, it is believed that when the amount of Al added is a certain value, for example, in a range not more than 5%, an upper limit, the effect obtained by addition of these elements can be exerted significantly to some extent without depending on the amount of Al added. Moreover, when the amount of Al or the like exceeds the upper limit, the physical properties of the oxide material can change significantly, which is obtained by trade-off with the effect obtained by addition of these elements. Therefore, it is considered to be essential that the composition of the oxide material is in the above range for conducting addition of Ir, Pt, Au, or Rh.

As described above, as the raw material which is a composition for growing the oxide material having a langasite-type structure, especially a single crystal thereof, and is used for the pulling down method, the present invention includes a raw material comprising a composition for producing any one included in the group consisting of $RE_3Ga_{5-x}Al_xSiO_{14}$ (wherein, RE represents an element selected from the group consisting of La, Ce, Pr, Nd, Sm, Eu, Gd, Tb, Dy, Ho, Er, Tm, Yb, Lu, Y, and Sc, which are rare earth elements, and $0 \leq X \leq 5$), $RE_3Ta_{0.5}Ga_{5.5-x}Al_xO_{14}$ (wherein, RE represents an element selected from the group consisting of La, Ce, Pr, Nd, Sm, Eu, Gd, Tb, Dy, Ho, Er, Tm, Yb, Lu, Y, and Sc, which are rare earth elements, and $0 \leq X \leq 5.5$), $RE_3Nb_{0.5}Ga_{5.5-x}Al_xO_{14}$ (wherein, RE represents an element selected from the group consisting of La, Ce, Pr, Nd, Sm, Eu, Gd, Tb, Dy, Ho, Er, Tm, Yb, Lu, Y, and Sc, which are rare earth elements, and $0 \leq X \leq 5.5$), $AE_3TaGa_{3-x}Al_xSi_2O_{14}$ (wherein, AE represents an element selected from the group consisting of Mg, Ca, Sr, and Ba, which are alkaline earth metal elements, and $0 \leq X \leq 3$), and $AE_3NbGa_{3-x}Al_xSi_2O_{14}$ (wherein, AE represents an element selected from the group consisting of Mg, Ca, Sr, and Ba, which are alkaline earth metal elements, and $0 \leq X \leq 3$), and further comprising at least one selected from the group consisting of Ir, Pt, Au, and Rh as an additive element, as one aspect. Also, the present invention includes a raw material comprising a composition for producing any one included in the group consisting of $La_3Ga_{5-x}Al_xSiO_{14}$ ($0 \leq X \leq 5$), $La_3Ta_{0.5}Ga_{5.5-X}Al_XO_{14}$ (0≤X≤5.5), $La_3Nb_{0.5}Ga_{5.5-X}Al_XO_{14}$ (0≤X≤5.5), $Ca_3TaGa_{3-X}Al_XSi_2O_{14}$ (0≤X≤3), $Ca_3NbGa_{3-X}Al_XSi_2O_{14}$ (0≤X≤3), $Sr_3TaGa_{3-X}Al_XSi_2O_{14}$ (0≤X≤3), and $Sr_3NbGa_{3-X}Al_XSi_2O_{14}$ (0≤X≤3), and further comprising at least one selected from the group consisting of Ir, Pt, Au, and Rh as an additive element, as one aspect.

Moreover, for the effect of achieving a preferable outer shape of a material or a crystal, the oxide material of the present invention includes an oxide material having a langasite-type structure, further a single crystal thereof, having a composition included in the group consisting of $RE_3Ga_{5-X}Al_XSiO_{14}$ (wherein, RE represents an element selected from the group consisting of La, Ce, Pr, Nd, Sm, Eu, Gd, Tb, Dy, Ho, Er, Tm, Yb, Lu, Y, and Sc, which are rare earth elements, and 0≤X≤5), $RE_3Ta_{0.5}Ga_{5.5-X}Al_XO_{14}$ (wherein, RE represents an element selected from the group consisting of La, Ce, Pr, Nd, Sm, Eu, Gd, Tb, Dy, Ho, Er, Tm, Yb, Lu, Y, and Sc, which are rare earth elements, and 0≤X≤5.5), $RE_3Nb_{0.5}Ga_{5.5-X}Al_XO_{14}$ (wherein, RE represents an element selected from the group consisting of La, Ce, Pr, Nd, Sm, Eu, Gd, Tb, Dy, Ho, Er, Tm, Yb, Lu, Y, and Sc, which are rare earth elements, and 0≤X≤5.5), $AE_3TaGa_{3-X}Al_XSi_2O_{14}$ (wherein, AE represents an element selected from the group consisting of Mg, Ca, Sr, and Ba, which are alkaline earth metal elements, and 0≤X≤3), and $AE_3NbGa_{3-X}Al_XSi_2O_{14}$ (wherein, AE represents an element selected from the group consisting of Mg, Ca, Sr, and Ba, which are alkaline earth metal elements, and 0≤X≤3), and comprising at least one selected from the group consisting of Ir, Pt, Au, and Rh as an additive element, as one aspect.

Further, the oxide material of the present invention includes an oxide material, further a single crystal thereof, having a composition included in the group consisting of $La_3Ga_{5-X}Al_XSiO_{14}$ (0≤X≤5), $La_3Ta_{0.5}Ga_{5.5-X}Al_XO_{14}$ (0≤X≤5.5), $La_3Nb_{0.5}Ga_{5.5-X}Al_XO_{14}$ (0≤X≤5.5), $Ca_3TaGa_{3-X}Al_XSi_2O_{14}$ (0≤X≤3), $Ca_3NbGa_{3-X}Al_XSi_2O_{14}$ (0≤X≤3), $Sr_3TaGa_{3-X}Al_XSi_2O_{14}$ (0≤X≤3), and $Sr_3NbGa_{3-X}Al_XSi_2O_{14}$ (0≤X≤3), and comprising at least one selected from the group consisting of Ir, Pt, Au, and Rh as an additive element, as a further aspect. Moreover, in these materials, more preferable physical properties can be obtained when the added Ir, Pt, Au, or Rh is contained in the final oxide material in a partial substitution manner such that these elements are further substituted for Al or Ga contained in the crystal. Therefore, the present invention includes the oxide material having a langasite-type structure described above in which Ir, Pt, Au, or Rh is contained in such a manner that these elements are further substituted for the substituted Al, as a further aspect. Furthermore, the present invention includes a single crystal made of the oxide material described above, as one aspect.

Figure 6:
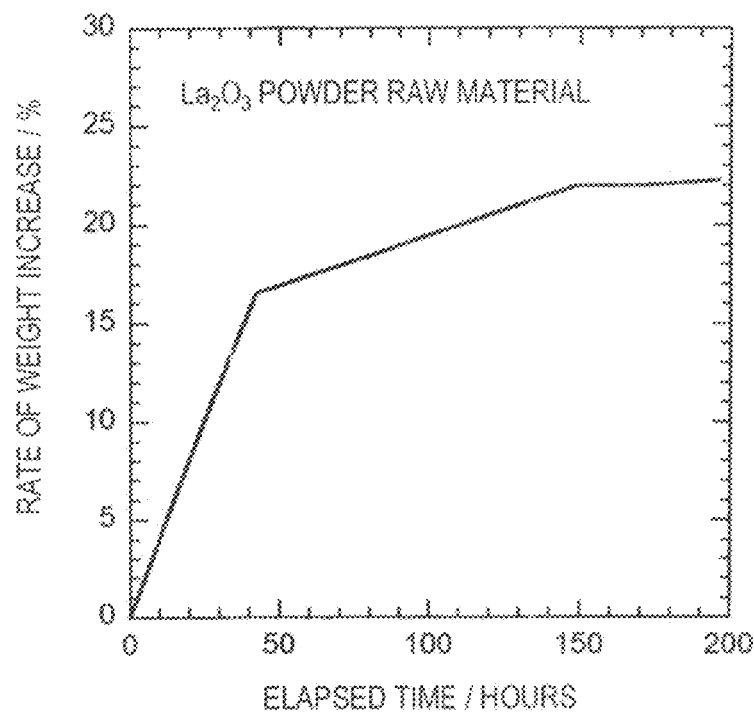
FIG. 6 is a diagram of a result of measurement of a rate of weight increase over time for the moisture absorbency of $La_2O_3$.
Figure 7:
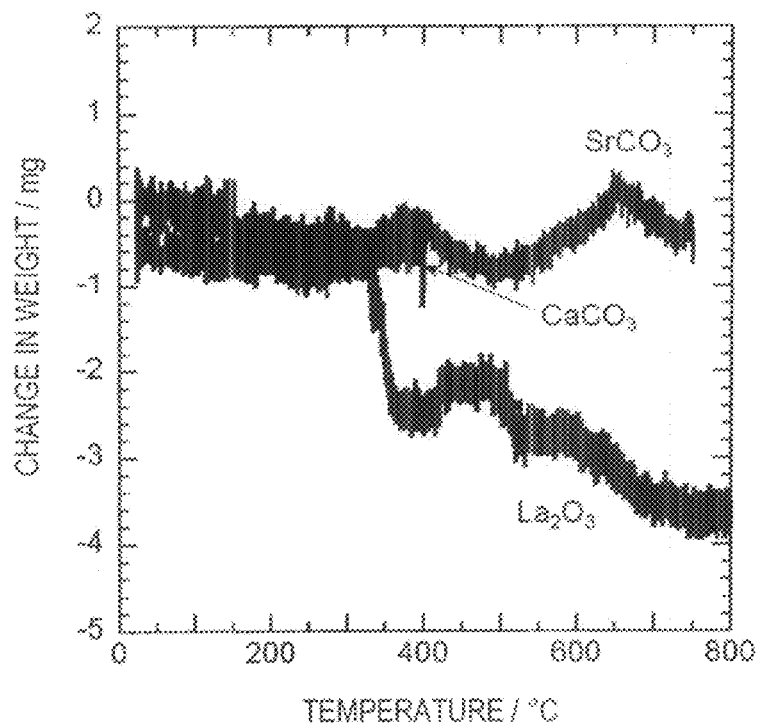
FIG. 7 is a diagram showing a change in weight of $CaCO_3$, $La_2O_3$, and $SrCO_3$ serving as raw materials when the holding temperatures of these materials are elevated.

In the case of obtaining an oxide material comprising La, $La_2O_3$ has the possibility of absorbing moisture in the operation of step 1 or the like due to higher moisture absorbency at ordinary temperature. A result obtained by actually confirming the moisture absorbency of $La_2O_3$ will be described below. FIG. 6 is a diagram of a result of measurement of a rate of weight increase over time for the moisture absorbency of $La_2O_3$ serving as raw material powders under the condition of leaving the powders in the atmosphere. The weight increases with time, which indicates that $La_2O_3$ is more likely to absorb moisture in the atmosphere. FIG. 7 is a diagram showing a change in weight of $CaCO_3$ powders, $La_2O_3$ powders, and $SrCO_3$ powders serving as raw materials when the holding temperatures are elevated after the powders are left for a certain period of time in the atmosphere. $CaCO_3$ and $SrCO_3$ have no big change in weight when the holding temperature is elevated. On the other hand, in the case of $La_2O_3$, the weight decreases with an increase in the holding temperature. Considering this result with that shown in FIG. 6, it is believed that $La_2O_3$ retained in the atmosphere is in a so-called condition of absorbing moisture, and the absorbed moisture volatilizes with an increase in the holding temperature, whereby the weight decreases.

Figure 8:
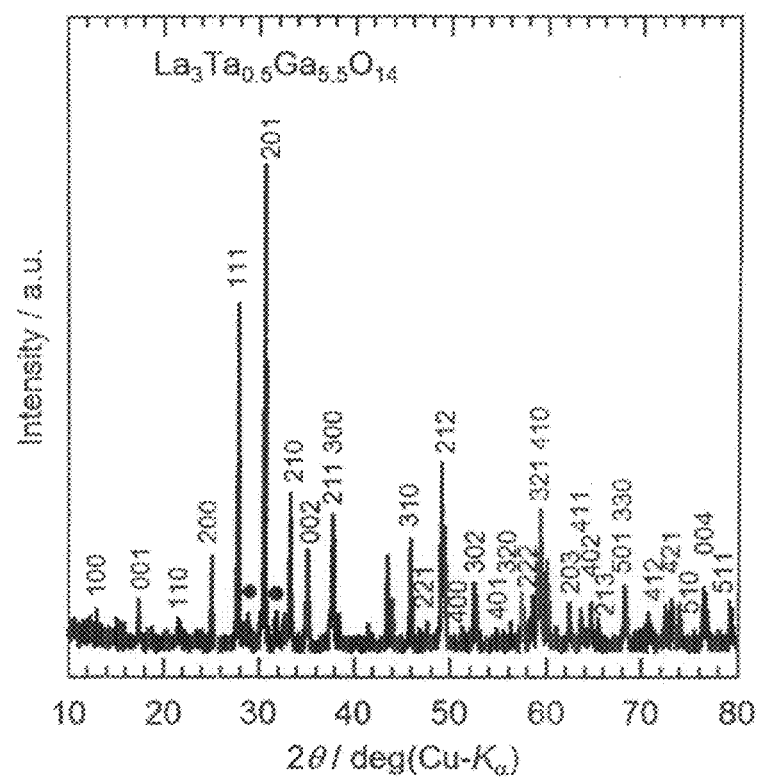
FIG. 8 is a diagram showing a result of measurement using XRD on raw material powders of $La_3Ta_{0.5}Ga_{5.5}O_{14}$ in the condition of containing moisture.

The absorbed moisture or the like shifts the composition of the finally obtained oxide material from a prescribed ratio and brings about embrittlement of the obtained crystal. FIG. 8 shows a result of measurement using X-ray diffractometer (XRD) on elements contained in raw material powders in the case of preparing the raw material powders of $La_3Ta_{0.5}Ga_{5.5}O_{14}$ by using $La_2O_3$ considered to be actually in the condition of absorbing moisture. In the Figure, a peak represented by a black circle is a peak of a compound which is not present naturally in $La_3Ta_{0.5}Ga_{5.5}O_{14}$, which indicates that there is a significant error in weighing of $La_2O_3$ (significant lack of $La_2O_3$) by using $La_2O_3$ retained in the atmosphere. As a result, this leads to an understanding that the composition ratio of the oxide material is likely to shift from the targeted value when such raw material powders are used. Therefore, in the case of an oxide material comprising La, a so-called pre-baking step and the like for removing the moisture are essential in addition to the preparation-packing steps. Moreover, the langasite-type oxide material comprising La has high wettability to the crucible, and the wettability changes sensitively when Au or the like described above is added. Therefore, it is necessary to strictly control the amount added for obtaining a preferable crystal material. On the other hand, in the case of the oxide material comprising an alkaline earth metal element such as Ca and Sr described above, there is no need to consider the phenomenon of moisture absorption for example by using a carbonate or the like, and controllability of the wettability is higher in comparison with the case of the oxide material comprising a rare earth metal such as La.

Moreover, the oxide material comprising an alkaline earth metal element naturally comprises Ga in a small amount and can be said to be fundamentally a system in which the effect of volatilization of Ga can be easily suppressed. Since Ga tends to increase the wettability of the melt of the material described above to the crucible, containing Ga in a small amount contributes to suppression of the wettability, further to improvement in the controllability of the wettability. Furthermore, reduction of a requisite amount of expensive β-$Ga_2O_3$ contributes to decrease in the raw material cost and the production cost of the oxide material, as in the case of using the alkaline earth metal element as a main component instead of the rare earth metal element.

From the viewpoints described above, as the raw material which is a composition for growing the oxide material having a langasite-type structure, especially a single crystal thereof, and is used for the pulling down method, the present invention preferably includes a raw material comprising a composition for producing any one included in the group consisting of the formula $AE_3TaGa_{3-X}Al_XSi_2O_{14}$ (1) (wherein, AE represents an element selected from the group consisting of Mg, Ca, Sr, and Ba, which are alkaline earth metal elements, and 0≤X≤3) and the formula $AE_3NbGa_{3-X}Al_XSi_2O_{14}$ (2) (wherein, AE represents an element selected from the group consisting of Mg, Ca, Sr, and Ba, which are alkaline earth metal elements, and 0≤X≤3), and further comprising at least one selected from the group consisting of Ir, Pt, Au, and Rh as an additive element, as one aspect. Moreover, the present invention more preferably includes a raw material comprising a composition for producing any one included in the group consisting of $Ca_3TaGa_{3-X}Al_XSi_2O_{14}$ (0≤X≤3), $Ca_3NbGa_{3-X}Al_XSi_2O_{14}$ ($0 \leq X \leq 3$), $Sr_3TaGa_{3-x}Al_xSi_2O_{14}$ ($0 \leq X \leq 3$), and $Sr_3NbGa_{3-x}Al_xSi_2O_{14}$ ($0 \leq X \leq 3$), and further comprising at least one selected from the group consisting of Ir, Pt, Au, and Rh as an additive element, as one aspect.

Here, in the present invention, it is considered to be most preferable at present to use a crucible made of Pt in view of eliminating the effects of dissolution on the melt of the raw material and the like. However, the crucible made of Pt has a softening temperature around 1500° C., and when the pulling down of the seed has to be performed at high temperatures equal to or higher than the softening temperature, there is a need to consider a change in the shape of the oxide material associated with a change in the shape of the crucible. From the viewpoints described above, the present invention more preferably includes an oxide material, further a single crystal thereof, having a composition included in the group consisting of $Sr_3NbGa_{3-x}Al_xSi_2O_{14}$ ($0 \leq X \leq 3$), $Ca_3TaGa_{3-x}Al_xSi_2O_{14}$ ($0 \leq X \leq 3$), and $Ca_3NbGa_{3-x}Al_xSi_2O_{14}$ ($0 \leq X \leq 3$), which have a melting temperature of 1500° C. or less, more preferably of less than 1470° C., whereby the softening temperature of the crucible can be reliably averted, sill more preferably of less than 1450° C., and comprising at least one selected from the group consisting of Ir, Pt, Au, and Rh as an additive element.

As described above, $\beta$-$Ga_2O_3$ is highly volatile, and it is considered to be preferable to reduce its content. In the case of an Al-substituted oxide material in which the Ga element is substituted by an Al element, a system comprising an alkaline earth material, which is a so-called order-type crystal, can contain the substituted element in a larger amount than a system comprising a rare earth material, which is a disorder-type crystal. Moreover, Al does not volatilize unlike Ga, and therefore, it is possible to reduce the production cost and suppress the composition variation during the production of the material. Furthermore, since Ga tends to increase the wettability of the melt of the raw material described above to the crucible, substitution by Al provides the effects of suppressing the wettability and improving the controllability of the wettability. Accordingly, in the present invention, a material in which a part or the whole of Ga is substituted by Al is considered to be preferable.

That is, for the effect of achieving a preferable shape of the material or the crystal, the oxide material of the present invention more preferably includes an oxide material having a langasite-type structure, further a single crystal thereof, having a composition included in the group consisting of the formula $AE_3TaGa_{3-x}Al_xSi_2O_{14}$ (1) (wherein, AE represents an element selected from the group consisting of Mg, Ca, Sr, and Ba, which are alkaline earth metal elements, and $0<X \leq 3$) and the formula $AE_3NbGa_{3-x}Al_xSi_2O_{14}$ (2) (wherein, AE represents an element selected from the group consisting of Mg, Ca, Sr, and Ba, which are alkaline earth metal elements, and $0<X \leq 3$), and comprising at least one selected from the group consisting of Ir, Pt, Au, and Rh as an additive element, as one aspect. In other words, it is more preferable that the value X is determined in the range of $0<X \leq 3$, which is a range except for $X=0$ in the composition formula of the above described material.

Moreover, by the same reason, the present invention more preferably includes an oxide material, further a single crystal thereof, having a composition included in the group consisting of $Ca_3TaGa_{3-x}Al_xSi_2O_{14}$ ($0<X \leq 3$), $Ca_3NbGa_{3-x}Al_xSi_2O_{14}$ ($0<X \leq 3$), $Sr_3TaGa_{3-x}Al_xSi_2O_{14}$ ($0<X \leq 3$), and $Sr_3NbGa_{3-x}Al_xSi_2O_{14}$ ($0<X \leq 3$), and comprising at least one selected from the group consisting of Ir, Pt, Au, and Rh as an additive element, as a further aspect. As for the material used as the additive elements, more preferable physical properties can be obtained when the added Ir, Pt, Au, or Rh is contained in the final oxide material in a partial substitution manner such that these elements are further substituted for Al or Ga contained in the crystal. Therefore, the present invention includes the oxide material having a langasite-type structure described above in which Ir, Pt, Au, or Rh is contained in such a manner that these elements are further substituted for the substituted Al, as a further aspect. Furthermore, the present invention includes a single crystal made of the oxide material described above, as one aspect.

In the embodiment of the production method described above, a case of adding at least one selected from the group consisting of Ir, Pt, Au, and Rh in step 1 was described. However, as described above, these additive elements may be used in combinations of a plurality thereof. Moreover, as an alternative embodiment, there can be employed a manner of adding an appropriate amount of these elements to the powder compact or the melt in step 3 or immediately before the leakage of the melt of the raw material through the hole of the crucible in step 4, that is, at an appropriate time during the melting of the raw material. Specifically, these elements or a mixture thereof in a state of a thin line or the like may be contacted with the molten raw material to be diffused in the melt of the raw material from the contact portion. The manner of adding these elements is not limited to the example described above, and various manners such as adding these elements in a molten or gasified state can be considered. According to this manner, control of the amount of these elements added to the melt of the raw material becomes difficult; however, there is no need to consider behavior of a Ir, Pt, Au, or Rh atom, such as diffusion, in the melt of the raw material present in the crucible by, for example, contacting these elements with the melt near the leakage portion. Alternatively, these elements may be present by, for example, attaching these elements to the crucible near the opening. According to this method, control of the amount of Ir, Pt, Au, or Rh added becomes difficult; however, the effect of reducing the number of steps can be exerted by eliminating the step of adding these elements.

The method for producing an oxide material described above can be applied to a method for producing an oxide material other than the above. By using the production method according to the present invention, it is possible to control the outer shape of such an oxide material by preferably control the wettability between the melt of raw material and the die portion. Therefore, in the present invention, considering methods for producing various types of oxide materials, it is preferable that the seed is defined as being moved in a direction in which the seed is relatively pulled away from the die portion. In this case, the moving operation is more preferably conducted along a prescribed axis, specifically a pulling down axis in the present invention. Moreover, the present invention may be used in a method in which a structure corresponding to the die portion in the present invention is not present, for example, a Czochralski method. In a method for crystal growth using a crucible such as the Czochralski method, there is a need to reliably remove a raw material remaining in the crucible after the completion of crystal growth because the crucible is repeatedly used. However, when the wettability between an inner wall of the crucible and the melt of the raw material is not controlled and the melt of the raw material wets and spreads in a wide region, removal of the remaining material becomes considerably difficult. By using a raw material having Au or the like added thereto or growing an oxide material comprising Au or the like as in the present invention, it is possible to control the wettability and then remove the remaining material quite easily than before.

The present invention is targeted at an oxide material having a langasite-type structure. However, the concept of the present invention is not limited to the oxide material, and can be applied to a crystal made of other materials, especially a material obtained by a pulling down method in which a crystal has a change in its outer shape such as a surface due to the wettability between a melt of a raw material and a die portion, and also applied to a method for producing the same.

The present application claims priority from Japanese Patent Application No. 2010-230705 filed on Oct. 13, 2010, the content of which is incorporated herein by reference.

REFERENCE SIGNS LIST

1: Crucible
3: Stage
5: After heater
7: Heat retaining tube
9: Working coil
11: Seed holding member
13: Powder compact (raw material)
15: Melt
17: Seed
19: Oxide material
step 1: Preparation of raw material
step 2: Packing of raw material
step 3: Melting of raw material
step 4: Leakage of melt of raw material
step 5: Seed touch
step 6: Pulling away of seed
step 7: Taking out of single crystal

The invention claimed is:
1. A langasite oxide material, comprising:
at least one element selected from the group consisting of Ir, Pt, Au, and Rh as an additive element; and
at least one of a compound represented by formula:

$$AE_3TaGa_{3-X}Al_XSi_2O_{14},$$

wherein AE represents an alkaline earth metal element selected from the group consisting of Mg, Ca, Sr, and Ba, and 0≤X≤3, or
a compound represented by formula:

$$AE_3NbGa_{3-X}Al_XSi_2O_{14},$$

wherein AE represents an alkaline earth metal element selected from the group consisting of Mg, Ca, Sr, and Ba and 0≤X≤3.

2. The langasite oxide material according to claim 1, having a melting temperature of less than 1470° C.

3. The langasite oxide material according to claim 1, wherein X is of 0<X≤3.

4. An oxide material, comprising:
at least one element selected from the group consisting of Ir, Pt, Au, and Rh as an additive element, and
at least one compound represented by $Ca_3TaGa_{3-X}Al_XSi_2O_{14}$ (0≤X≤3), $Ca_3NbGa_{3-X}Al_XSi_2O_{14}$ (0≤X≤3), $Sr_3TaGa_{3-X}Al_XSi_2O_{14}$ (0≤X≤3), or $Sr_3NbGa_{3-X}Al_XSi_2O_{14}$ (0≤X≤3).

5. The oxide material according to claim 4, having a melting temperature of less than 1470° C.

6. The oxide material according to claim 4, wherein X is of 0<X≤3.

7. A single crystal, comprising the langasite oxide material according to claim 1.

8. A single crystal, comprising the oxide material according to claim 4.

* * * * *